United States Patent
Kim et al.

(10) Patent No.: US 6,893,738 B2
(45) Date of Patent: May 17, 2005

(54) ELECTRODEPOSITED COPPER FOIL FOR PCB HAVING BARRIER LAYER OF ZN-CO-AS ALLOY AND SURFACE TREATMENT METHOD OF THE COPPER FOIL

(75) Inventors: Sang-Kyum Kim, Kyunggi-do (KR); Chang-Hee Choi, Seoul (KR)

(73) Assignee: LG Cable Ltd. (KR)

(*) Notice: Subject to any disclaimer, the term of this patent is extended or adjusted under 35 U.S.C. 154(b) by 301 days.

(21) Appl. No.: 10/278,645

(22) Filed: Oct. 23, 2002

(65) Prior Publication Data

US 2003/0121789 A1 Jul. 3, 2003

(30) Foreign Application Priority Data

Oct. 23, 2001 (KR) .................. 10-2001-0065237

(51) Int. Cl.$^7$ .......................... B32B 15/00; C25D 7/06
(52) U.S. Cl. .................. 428/658; 205/152; 205/238; 205/245; 205/255; 205/155; 428/607; 428/668; 428/674; 428/675; 428/926; 428/935
(58) Field of Search ................ 428/607, 658, 428/668, 674, 675, 926, 935; 205/152, 155, 238, 245, 255

(56) References Cited

U.S. PATENT DOCUMENTS

| 3,585,010 A | 6/1971 | Luce et al. | 428/608 |
| 4,049,481 A | 9/1977 | Morisaki | 428/658 |
| 5,366,814 A * | 11/1994 | Yamanishi et al. | 428/607 |
| 6,342,308 B1 * | 1/2002 | Yates et al. | 428/607 |

FOREIGN PATENT DOCUMENTS

| KR | 1019930001934 | 3/1993 |
| KR | 93006103 B1 | 7/1993 |
| KR | 100294394 B1 | 4/2001 |

* cited by examiner

Primary Examiner—Robert R. Koehler
(74) Attorney, Agent, or Firm—Cantor Colburn LLP

(57) ABSTRACT

An electrodeposited copper foil to be laminated on an insulation substrate for a printed circuit board, comprising a barrier layer of ternary alloy of Zn—Co—As formed on the copper foil, is provided. Further, a surface treatment method of an electrodeposited copper foil for a printed circuit board, comprising electrolytically treating the copper foil in an electrolytic solution containing pyrophosphoric acid potassium of about 10 g/l to about 200 g/l, Zn of about 0.1 g/l to about 20 g/l, Co of about 0.1 g/l to about 20 g/l and As of about 0.05 g/l to about 5 g/l, is provided. Further, the electrolytic solution remains at the temperature of about 20° C. to about 50° C. and a pH of about 9 to about 13. The copper foil is electrolytically treated for about 2 seconds to about 20 seconds at a cathode current density of about 0.5 A/dm$^2$ to about 20 A/dm$^2$.

9 Claims, 2 Drawing Sheets

ELECTRODEPOSITED COPPER FOIL FOR PCB HAVING BARRIER LAYER OF ZN-CO-AS ALLOY AND SURFACE TREATMENT METHOD OF THE COPPER FOIL

BACKGROUND OF THE INVENTION

1. Field of the Invention

The present invention relates to an electrodeposited copper foil laminated on an insulation substrate for printed circuit boards and a surface treatment method thereof. More particularly it relates to an electrodeposited copper foil for printed circuit boards and a surface treatment method in which a barrier layer of alloy of Zn—Co—As is formed on the electrodeposited copper foil so that adhesive strength to the insulation substrate, heat-resistance, and anticorrosion are improved, and in which innoxiousness and anticorrosion of equipment can be assured by using pyrophosphoric acid potassium as a complexing agent in the electrolytic process.

2. Description of the Related Art

Generally, printed circuit boards are widely used in a variety of electronic applications, such as radios, televisions, washing machines, VCR, computers, etc., and precise controllers for industrial electronic devices. Recently, printed circuit boards are developed to meet the demand for fineness, miniaturization and high density of integration of the electronic articles, which requires high quality of the printed circuit board.

For example, a flame-retardant prepreg that is made of epoxy resin and glass fibers impregnated therein as insulation substrates for industrial printed circuits. The printed circuit board is fabricated by laminating the electrodeposited copper foil on the insulation substrate at high pressure and temperature, and then etching the copper to the circuit pattern.

Raw materials for the electrodeposited copper foil are formed by consecutive electrolytic deposition in copper sulfate solution. The surface of the raw foil is nodularized for better adhesion with respect to the insulation substrate. Consequently, the electrodeposited copper foil is obtained by electrodepositing a barrier layer on the nodularized surface, and then treating the barrier layer with electrolytic chromate anticorrosion process.

However, brown stains and spottings frequently appear through out the resinous layer of the finished printed circuit board, which tend to adversely affect the insulation properties of the resin and consequently the performance of the printed circuits so that the physical properties of the final product are undesirable. The actual mechanism for the brown stain is not fully understood. However, the cause appears to be the result of chemical and mechanical interaction between the copper foil and the resinous layer. Such a drawback may cause degradation of the adhesion between the copper foil and the insulation substrate in the process of lamination that involves high pressure and high temperature treatment.

To solve the above problem, U.S. Pat. Nos. 3,585,010 and 4,049,481 disclose surface treatment methods of copper foil by which the brown stains are removed during the adhesion of the insulation substrate and the copper foil. A copper foil having excellent adhesion can be obtained. Also, Korean Pat. No. 065333 issued at 1993 provides a method in which alloy of Cu—As is coated using pulse current to thereby improve the adhesion to the insulation substrate.

According to the conventional methods to obtain the electrodeposited copper foil, copper oxides on the surface of the raw foil (that is laminated with the insulation substrate) are removed to activate the surface. Then, the surface is treated to provide a nodularized surface with copper, and a barrier layer is electrolytically formed on the surface. Finally, the surface is processed by anticorrosive treatment. A metal used for the barrier layer comprises nickel, tin, zinc, cadmium, arsenic or an alloy thereof. It is known that the above metal and alloy prevent stains at the interface of the adhesion, enable heat-resistant adhesion between the insulation substrate resin and the copper foil, and facilitate etching of the copper foil. Most electrolytic precipitation of metal is conducted in the solution of metal complexing compound rather than plain metal ions. Also, the electrolytic deposition formed in the bath of metal complexing compound exhibits excellent electrodeposition property so that uniform electrodeposition can be made to deep grooves as well as nodules on the surface to become minute, uniform and brilliant deposited film. Further the electrolytic deposition enables electrochemical coating with alloy of base metal and noble metal.

However, the product formed by the conventional method has inferior properties in heat-resistance and anticorrosion, particularly, in the process of copper clad laminating and the manufacture of the printed circuit board. Also, the surface treatment of the barrier layer using brass may cause 'undercutting' phenomenon in which the adhesive area between the copper foil circuit and the insulation substrate layer decreases because zinc has a rapid corrosion tendency compared to copper in the solution of copper chloride (I), iron chloride (II) or ammonium persulfate during the formation of circuits, which leads to the separation of copper foil circuit from the insulation substrate.

In the above conventional method, the complexing agent in the electrolytic solution to form the alloy layer during the formation of barrier layer comprises cyanogen CN, sodium citrate $Na_3C_6H_5O_7$, and tartaric acid.

However, the electrolytic solution containing cyanogen as the complexing agent is excellent in plating, but is a toxic solution that may produce poisonous gases during the manufacture and cause environmental pollution. Further, the solution containing sodium citrate is acidic resulting in corrosion of equipment, and tartaric acid is unstable particularly in the plating process of alloy metal having high ionization tendency.

SUMMARY OF THE INVENTION

According to one aspect of the present invention, a surface treatment method provides electrodeposited copper foils having excellent heat-resistance and anticorrosion properties by forming a barrier layer of alloy of Zn—Co—As to thereby increase adhesive strength with respect to an insulation substrate. Also, according to the present invention, since electrolytic solution containing pyrophosphoric acid potassium ($K_4P_2O_7$) as a complexing agent is used, a poisonous process and corrosion of equipment can be prevented.

According to another aspect of the present invention, an electrodeposited copper foil to be laminated on an insulation substrate for printed circuit boards comprises a barrier layer of ternary alloy of Zn—Co—As formed on the copper foil.

The thickness of the barrier layer may be about 0.01 $\mu$m to about 0.2 $\mu$m.

The copper foil is electrolytically treated in an electrolytic solution containing Zn of about 0.1 g/l to about 20 g/l, Co of about 0.1 g/l to about 20 g/l, As of about 0.05 g/l to about 5 g/l, and pyrophosphoric acid potassium of about 10 g/l to about 200 g/l, respectively.

Furthermore, the electrolytic solution remains at a temperature of about 20° C. to about 50° C. and at about pH 9 to about pH 13. Preferably, the copper foil is electrolytically treated for about 2 seconds to about 20 seconds at a cathode current density of about 0.5 A/dm² to about 20 A/dm².

BRIEF DESCRIPTION OF THE DRAWINGS

These and other features, aspects, and advantages of the present invention will become better understood with regard to the following description, appended claims, and accompanying drawings. In the drawings:

DETAILED DESCRIPTION OF PREFERRED EMBODIMENTS

Figure 1:
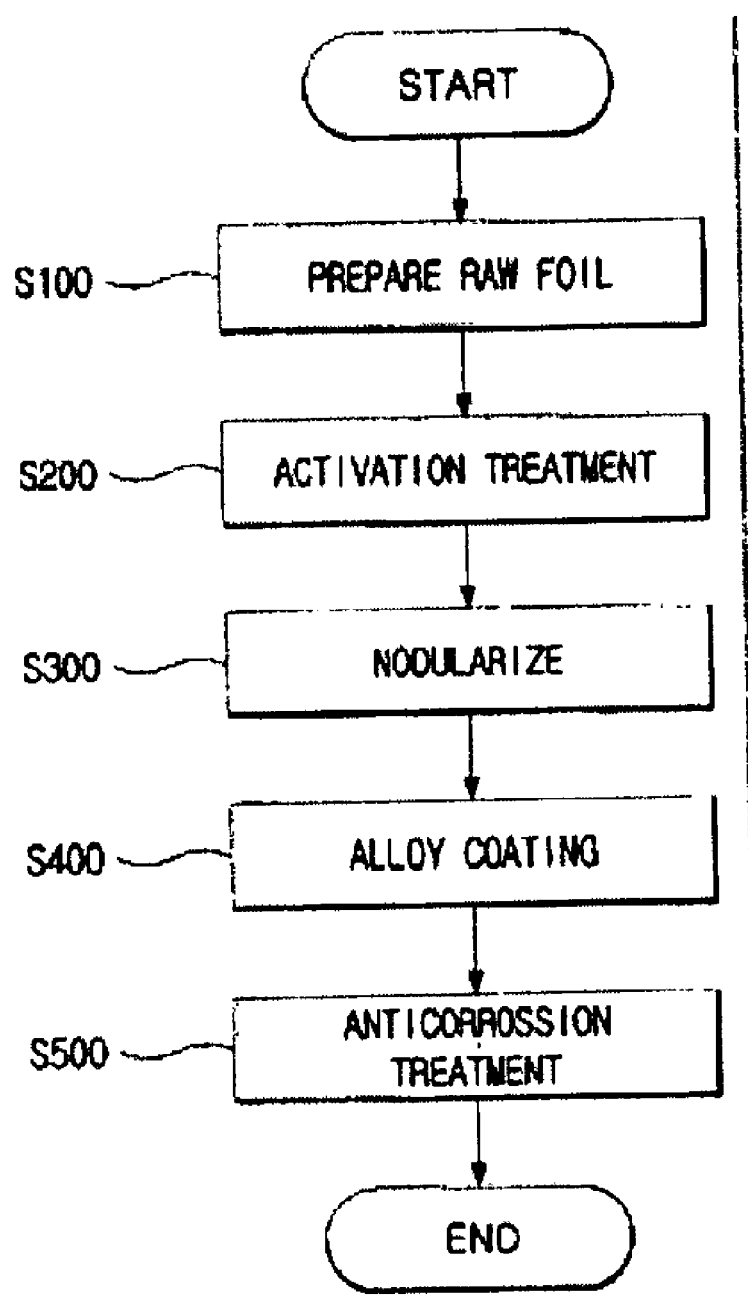
FIG. 1 is a flow chart showing a surface treatment method according to a preferred embodiment of the present invention.
Figure 2:
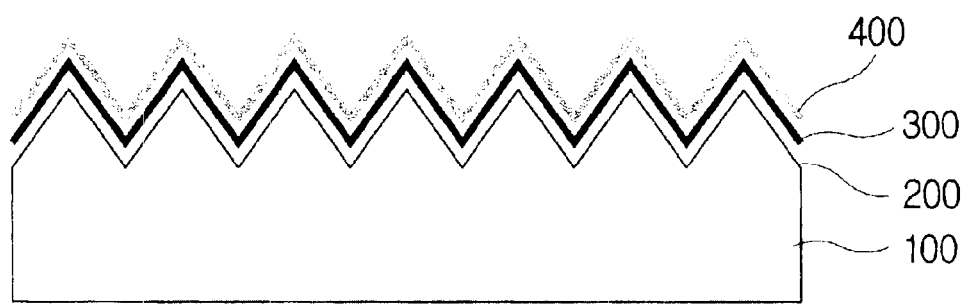
FIG. 2 is a sectional view of an electrodeposited copper foil according to a preferred embodiment of the present invention.

Hereinafter, preferred embodiments of the present invention will be described in detail with reference to the accompanying drawings. FIGS. 1 and 2 show a surface treatment method and an electrodeposited copper foil according to a preferred embodiment of the present invention, respectively.

A surface treatment method of an electrodeposited copper foil according to the present invention will be described, as follows.

First, a raw foil 100 to be laminated on an insulation substrate is formed in a solution of copper sulfate by a successive electrodeposition process (S100). The surface of the raw foil to be treated is activated by removing copper oxides thereon (S200). Then, the surface of the raw foil is nodularized for improvement of physical adhesion with the insulation substrate to thereby form a layer of nodule 200 on the raw copper foil 100 (S300). A barrier layer 300 is formed by coating the nodularized surface of the foil with alloy to enhance chemical adhesion (S400). Finally, electrolytic chromate anticorrosion treatment is carried out with respect to the surface so that the electrodeposited copper foil for a printed circuit board on which a layer of chromate 400 is formed can be obtained (S500).

According to the embodiment of the present invention, in the step S400, the barrier layer 300 coated on the surface is made of ternary alloy of Zn—Co—As. Thus, quaternary alloy of Cu—Zn—Co—As is formed between the electrodeposited copper foil and the insulation substrate layer after forming the insulation substrate at high pressure and temperature.

Zinc and cobalt prevent copper ions from diffusing into the insulation substrate during the formation with the insulation substrate at high temperatures to thereby decrease the degradation of the insulation substrate and maintain the insulation property thereof. The concentration of the electrolytic solution for both of zinc and cobalt is preferably in the range of about 0.1 g/l to about 20 g/l. It takes a long time for process at less than about 0.1 g/l, which affects productivity and decreases current efficiency. On the contrary, at the concentration more than about 20 g/l, even though the plating can be made, the process consumes greater amounts of pyrophosphoric acid potassium as the complexing agent, which is not preferable in terms of yield expenses.

Arsenic restrains escape of zinc in the alloy layer and the undercutting phenomenon even when using chemical agents such as hydrochloric acid. In addition, arsenic improves the heat-resistance together with zinc during the formation with the insulation substrate at high temperature. At this time, the concentration of the electrolytic solution for arsenic preferably lies in the range of about 0.05 g/l to about 5 g/l. It takes a long time for the process at less than about 0.05 g/l, which is not enough for full-alloy. Contrarily, at the concentration more than about 5 g/l, it results in excess of arsenic in the alloy layer and consumes large amounts of pyrophosphoric acid potassium as the complexing agent, which is not preferable for the same reason as mentioned above.

Preferably, the temperature of the electrolytic solution is about 20° C. to about 50° C. At a lower temperature than about 20° C., it is difficult for metallic ions to dissolve into the solution. At a higher temperature than 50° C., the coated surface is not uniform because the control of solution is difficult. The electrolytic solution preferably remains alkaline at about pH9 to about pH13.

In addition, the thickness of the alloy coating layer is preferably in the range of about 0.01 $\mu$m to about 0.2 $\mu$m. As the alloy coating layer becomes thinner, the alloy loses effectiveness. Otherwise, if the alloy coating layer is too thick, it takes long time to etch the printed circuit boards. The thickness of the alloy coating film is controlled by means of treatment time and cathode current density. Preferably, the treatment time and the cathode current density may be set to about 2 seconds to about 20 seconds and about 0.5 A/dm² to about 20 A/dm², respectively.

Using pyrophosphoric acid potassium as a complexing agent results in the combination of pyrophosphoric and metallic ions such as zinc, cobalt and arsenic to form a complex compound. The complex compound electrochemically minimizes the gap between the ionization tendency of zinc, which has a relatively high ionization tendency, and arsenic which has a relatively low ionization tendency so that an alloy of Zn—Co—As can be obtained.

Here, the amount of pyrophosphoric acid potassium in the electrolytic solution shall be more than that of metallic ions, preferably to about 10 g/l to about 200 g/l. In the case of the amount less than about 10 g/l, metallic ions in the electrolytic solution cannot fully form into the complex compound, but precipitate as metallic hydroxides. As a result, the alloy-coating surface is not uniform and the lifespan of plating solution is short due to the increase in $HPO_3^-$ that is generated in the electrolytic reaction. Also, at an amount of more than about 20 g/l, even though the plating can be made, it requires greater amounts of pyrophosphoric acid potassium, which is not preferable in the aspect of yield expenses.

Hereinafter, an embodiment of the present invention and advantages thereof will be described compared to the conventional surface treatment methods.

According to the embodiment of the present invention, a copper foil is treated with Zn—Co—As alloy surface treatment based on the following condition.

| Composition of solution | |
|---|---|
| Zinc sulfate (as Zn) | 10 g/l |
| Cobalt sulfate (as Co) | 10 g/l |
| Arsenious acid (as As) | 1 g/l |
| Pyrophosphoric acid potassium | 120 g/l |
| Condition of process | |
| Temperature of solution | 40° C. |
| pH | 11 |

-continued

| | |
|---|---|
| Cathode current density | 10 A/dm² |
| Treatment time | 5 seconds |

A Zn—Sn surface treatment is accomplished by the conventional surface treatment method as a comparative example, as follows.

| | |
|---|---|
| Composition of solution | |
| Zinc sulfate (as Zn) | 10 g/l |
| Tin sulfate (as Sn) | 10 g/l |
| Arsenious acid (as As) | 1 g/l |
| Pyrophosphoric acid potassium | 120 g/l |
| Condition of process | |
| Temperature of solution | 40° C. |
| pH | 11 |
| Cathode current density | 10 A/dm² |
| Treatment time | 5 seconds |

The copper foils treated according to the methods is press-laminated on the insulation substrate and then etched. The table shows the bonding strength of the copper foils after laminating and etching, respectively treated according to the invention and the comparative example.

| | Bonding strength (kgf/cm) | |
|---|---|---|
| | After laminating | After etching |
| Present Invention | 2.5 | 2.3 |
| Comparative example | 2.2 | 2.0 |

As shown in the above table, the substrate of the copper foil treated according to the present invention exhibits higher adhesive strength after laminating and etching than that of the copper foil treated according to the comparative example.

According to the electrodeposited copper foil for a printed circuit board and the surface treatment method, a barrier layer of alloy of Zn—Co—As formed on the electrodeposited copper foil enhances the bonding strength with respect to the insulation substrate, the heat-resistance and anticorrosion of the electrodeposited copper foil. At the same time, innoxiousness and anticorrosion of equipment can be assured by using the solution comprising pyrophosphoric acid potassium as a complexing agent in the electrolytic process.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An electrodeposited copper foil to be laminated on an insulation substrate for a printed circuit board, comprising:

a barrier layer comprising a ternary alloy of Zn—Co—As formed on the copper foil.

2. The electrodeposited copper foil according to claim 1, wherein a thickness of the barrier layer is about 0.01 μm to about 0.2 μm.

3. A surface treatment method of an electrodeposited copper foil for a printed circuit board, comprising:

electrolytically treating the copper foil in an electrolytic solution comprising pyrophosphoric acid potassium, Zn, Co, and As; and forming a barrier layer comprising ternary alloy of Zn—Co—As on the copper foil.

4. The surface treatment method of an electrodeposited copper foil according to claim 3, wherein a concentration of Zn, Co and As in the electrolytic solution is about 0.1 g/l to about 20 g/l, about 0.1 g/l to about 20 g/l and about 0.05 g/l to about 5 g/l, respectively.

5. The surface treatment method of an electrodeposited copper foil according to claim 3, wherein the electrolytic solution remains at a temperature of about 20° C. to about 50° C.

6. The surface treatment method of an electrodeposited copper foil according to claim 3, wherein the copper foil is electrolytically treated for about 2 seconds to about 20 seconds at a cathode current density of about 0.5 A/dm² to about 20 A/dm².

7. The surface treatment method of an electrodeposited copper foil according to claim 3, wherein the forming the barrier layer comprises forming the barrier layer having a thickness of about 0.01 μm to about 0.2 μm.

8. The surface treatment of an electrodeposited copper foil according to claim 3, wherein a concentration of the pyrophosphoric acid potassium is about 10 g/l to about 200 g/l.

9. The surface treatment method of an electrodeposited copper foil according to claim 3, wherein the electrolytic solution remains at a pH of about 9 to about 13.

* * * * *